(12) United States Patent
Borthakur et al.

(10) Patent No.: US 9,293,495 B2
(45) Date of Patent: Mar. 22, 2016

(54) IMAGING CIRCUITRY WITH ROBUST SCRIBE LINE STRUCTURES

(71) Applicant: Semiconductor Components Industries, LLC, Phoenix, AZ (US)

(72) Inventors: Swarnal Borthakur, Boise, ID (US); Marc Sulfridge, Boise, ID (US); Mitchell J. Mooney, Star, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 5 days.

(21) Appl. No.: 14/270,236

(22) Filed: May 5, 2014

(65) Prior Publication Data

US 2015/0318322 A1    Nov. 5, 2015

(51) Int. Cl.
*H01L 27/146* (2006.01)
*H04N 5/369* (2011.01)

(52) U.S. Cl.
CPC ...... *H01L 27/14632* (2013.01); *H01L 27/1462* (2013.01); *H01L 27/1464* (2013.01); *H01L 27/14636* (2013.01); *H01L 27/14685* (2013.01); *H01L 27/14687* (2013.01); *H04N 5/3692* (2013.01)

(58) Field of Classification Search
None
See application file for complete search history.

(56) References Cited

U.S. PATENT DOCUMENTS

| | | | |
|---|---|---|---|
| 7,652,313 B2 | 1/2010 | Ellis-Monaghan et al. | |
| 7,925,154 B2 | 4/2011 | Ryu | |
| 8,373,243 B2 | 2/2013 | Tai et al. | |
| 8,497,536 B2 | 7/2013 | Chen et al. | |
| 8,546,739 B2 | 10/2013 | Hsuan et al. | |
| 8,597,074 B2 | 12/2013 | Farnworth et al. | |
| 8,692,358 B2 | 4/2014 | Huang et al. | |
| 2005/0158907 A1* | 7/2005 | Sze et al. | 438/65 |
| 2006/0180885 A1 | 8/2006 | Rhodes | |
| 2008/0093695 A1* | 4/2008 | Gao et al. | 257/428 |
| 2013/0001787 A1* | 1/2013 | Yoshizawa et al. | 257/762 |
| 2013/0068929 A1 | 3/2013 | Solhusvik et al. | |
| 2013/0070109 A1 | 3/2013 | Gove et al. | |
| 2013/0214375 A1 | 8/2013 | Dai et al. | |
| 2013/0221470 A1 | 8/2013 | Kinsman et al. | |
| 2014/0055654 A1 | 2/2014 | Borthakur et al. | |
| 2014/0077323 A1 | 3/2014 | Velichko et al. | |
| 2015/0145094 A1* | 5/2015 | Liu et al. | 257/459 |

OTHER PUBLICATIONS

Borthakur et al., U.S. Appl. No. 14/191,965, filed Feb. 27, 2014.
Borthakur et al., U.S. Appl. No. 14/254,196, filed Apr. 16, 2014.

* cited by examiner

*Primary Examiner* — Anthony Ho
*Assistant Examiner* — Kevin Quinto
(74) *Attorney, Agent, or Firm* — Treyz Law Group, P.C.; Jason Tsai; Joseph F. Guihan

(57) ABSTRACT

An image sensor wafer may be stacked on top of a digital signal processor (DSP) wafer. The image sensor wafer may include multiple image sensor dies, whereas the DSP wafer may include multiple DSP dies. The stacked wafers may be cut along scribe line regions to dice the wafers into individual components. Each image sensor die may include through-oxide vias (TOVs) that extend at least partially into a corresponding DSP die. Scribe line support structures may be formed surrounding the scribe line regions. The scribe line support structures and the TOVs may be formed during the same processing step. The TOVs can also be formed through deep trench isolation structures.

18 Claims, 5 Drawing Sheets

IMAGING CIRCUITRY WITH ROBUST SCRIBE LINE STRUCTURES

BACKGROUND

This relates generally to imaging systems, and more particularly, to imaging systems with stacked integrated circuit dies.

Modern electronic devices such as cellular telephones, cameras, and computers often use digital image sensors. Imaging systems (i.e., image sensors) often include a two-dimensional array of image sensing pixels. Each pixel typically includes a photosensitive element such as a photodiode that receives incident photons (light) and converts the photons into electrical signals. The imaging system contains an image sensor die with an image sensor integrated circuit and an array of photodiodes. The image sensor die is mounted on a digital signal processor (DSP) die.

In conventional imaging systems, a first wafer that includes multiple image sensor dies is mounted on top of a second wafer that includes multiple DSP dies. The first and second wafers may then be cut along scribe line regions to dice the stacked wafers into individually stacked dies. Typically, the scribe line regions are devoid of any silicon substrate material. The lack of silicon substrate material in the scribe line regions may present challenges when forming color filter array structures for the image sensor die since the upper surface of the image sensor die tends to be non-uniform when at least a portion of the silicon substrate is removed in the scribe line regions.

In such arrangements, at least some oxide material is disposed in the scribe line regions. The interface between the oxide material in the scribe line regions and adjacent silicon substrate material may be also be prone to damage and cracking during dicing operations.

It would therefore be desirable to provide imaging systems with improved scribe line regions.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
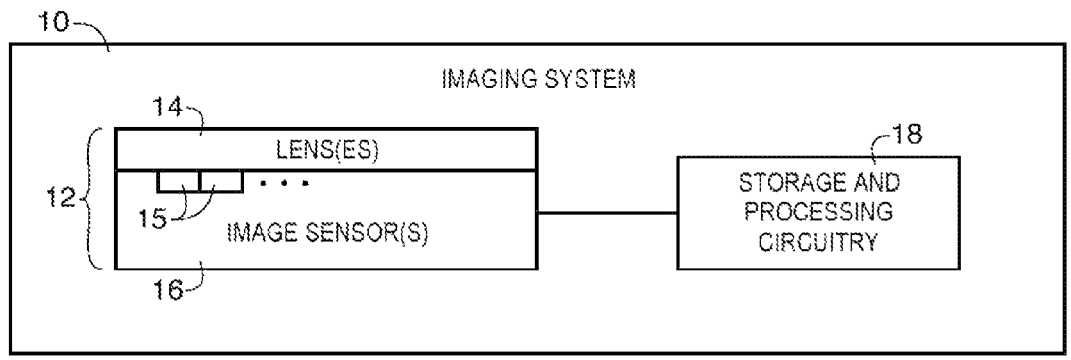
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. Image sensor 16 may, for example, be a backside illumination (BSI) image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
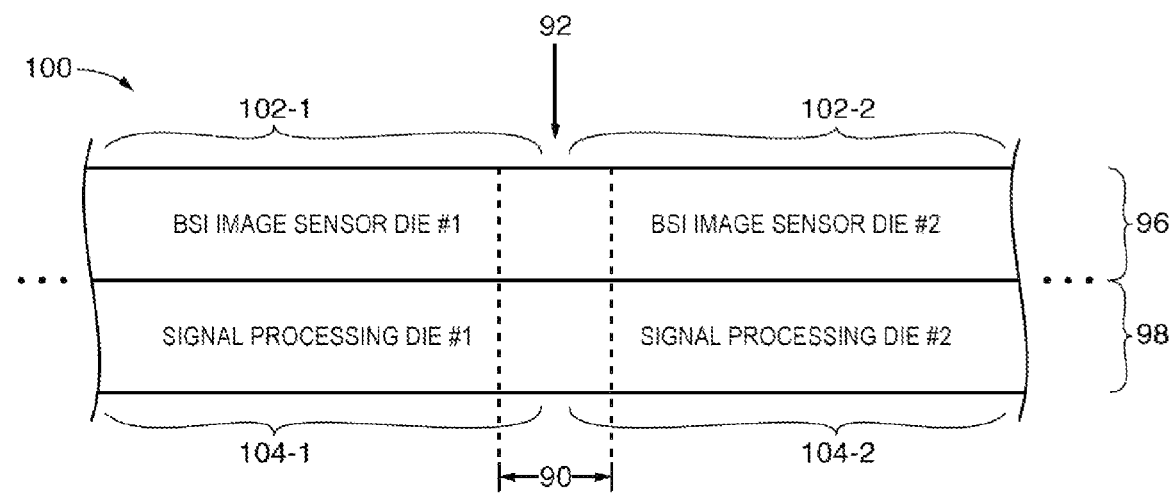
FIG. 2 is a diagram showing a first wafer that includes multiple backside illuminated (BSI) image sensor dies stacked on top of a second wafer that includes multiple signal processing dies in accordance with an embodiment of the present invention.

FIG. 2 shows an imaging system 100 that includes a first wafer 96 stacked on top of a second wafer 98. First wafer 96 may include a plurality of image sensor dies 102 (e.g., image sensor dies 102-1, 102-2, etc.), whereas second wafer 98 may include a plurality of signal processor dies 104 (e.g., digital signal processor dies 104-1, 104-2, etc.). Image sensor dies 102 may be backside illuminated (BSI) image sensors (as an example). Each image sensor die 102 may include an array of image sensor pixels operable to produce image data (i.e., still or video data). Image data produced by image sensor die 102 may then be fed to a corresponding signal processing die 104 for further processing (e.g., to the signal processor die on which that image sensor die is stacked). Die 104 may sometimes be referred to as a digital signal processor (DSP). The example of FIG. 2 is merely illustrative. If desired, image sensor die 102 may be a front-side illuminated (FSI) image sensor die.

The region between adjacent dies where the first and second wafers should be cut to dice the wafers into individual components are sometimes referred to as scribe line regions 90. During wafer dicing operations, a mechanical saw, laser, or other suitable dicing mechanisms may be employed to cut the stacked wafers 96 and 98 into individual stacked dies (as indicated by arrow 92).

In conventional imaging systems, the scribe line regions are devoid of any silicon substrate material. The lack of silicon substrate material in the scribe line regions may present challenges when forming color filter elements over the image sensor die since the upper surface of the image sensor die tends to be non-planar when at least a portion of the silicon substrate is removed from the scribe line regions. Typically, at least some oxide material is disposed in the scribe line regions. The interface between the oxide material in the scribe line regions and adjacent silicon substrate material may be also be prone to damage and cracking during dicing operations.

Figure 3:
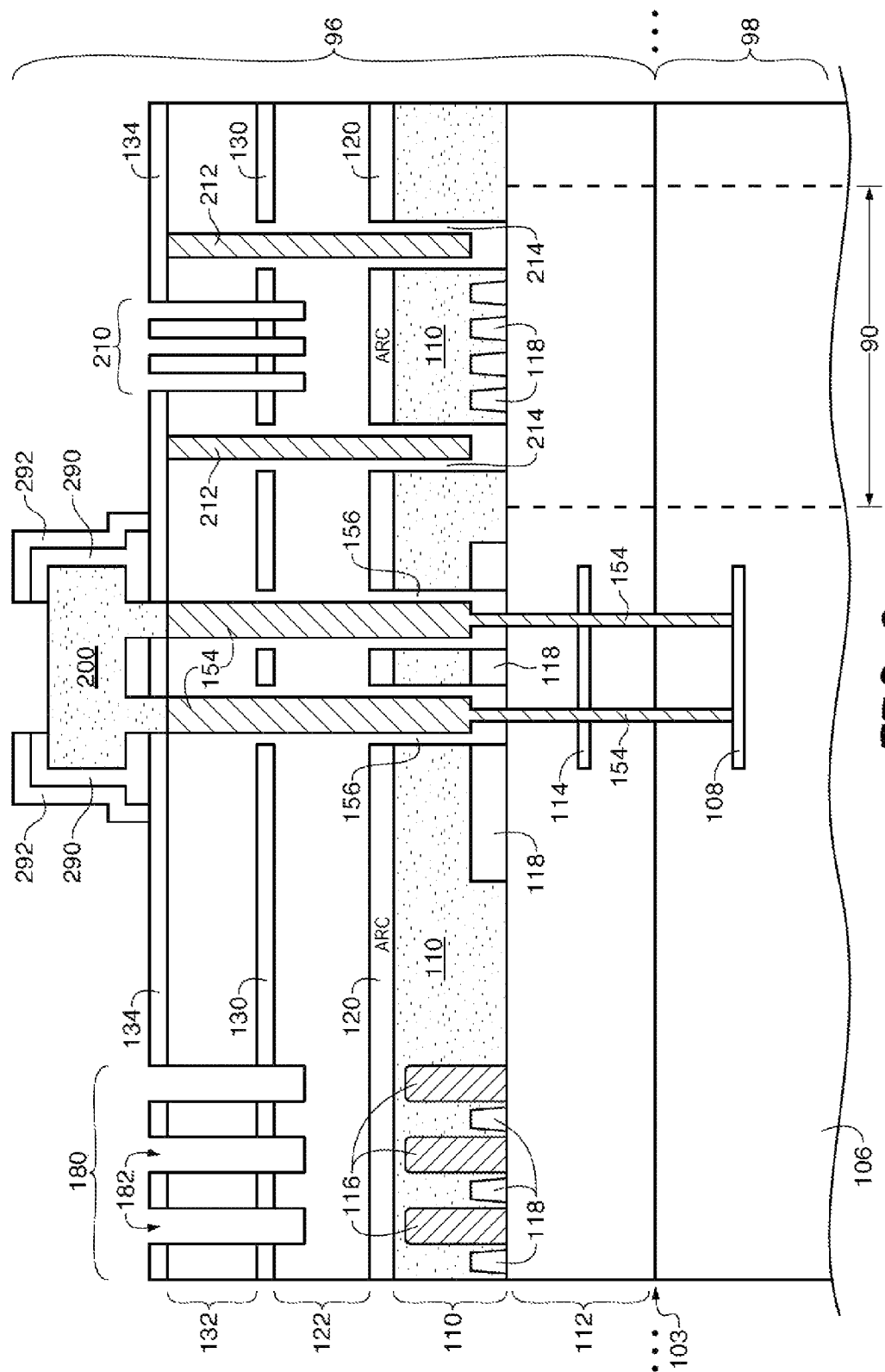
FIG. 3 is a cross-sectional side view of an illustrative imaging system having color filter array housing structures and having metal trench structures surrounding scribe line regions in accordance with an embodiment of the present invention.

In accordance with an embodiment of the present invention, an image sensor die with improved scribe line (SL) features is provided. FIG. 3 is a cross-sectional side view of an image sensor wafer 96 that is stacked on top of signal processing wafer 98. The interface at which wafers 96 and 98 contact one another is marked by arrow 103. Stacked wafers 96 and 98 may be cut along scribe line (or otherwise known as "scribe lane") regions such as region 90 to separate the wafers into individually stacked dies 102 and 104.

As shown in FIG. 3, wafer 96 may include a substrate 110 having a front surface and a back surface and interconnect routing layers 112 formed on the front surface of substrate 110. Layers 112 may include alternating metal routing layers and via layers (e.g., routing structures formed in dielectric material) and may sometimes be referred to collectively as a dielectric stack or redistribution layers.

Photosensitive elements such as photodiodes 116 may be formed at the front surface of substrate 110. Photodiodes 116 that are formed in an "active" portion of image sensor die 102 may receive incoming light and convert the incoming light into corresponding pixel signals. Shallow trench isolation (STI) structures such as STI structures 118 may be formed in the front surface of substrate 110 between each adjacent pair of photodiodes 116. STI structures 118 may serve to ensure that neighboring photodiodes 116 are electrically isolated from one another.

An antireflective coating (ARC) layer such as ARC layer 120 may be formed at the back surface of substrate 110. Layer 120 may be formed from hafnium oxide (as an example). ARC layer 120 may serve to ensure that light entering substrate 110 from the back side is not reflected back towards the direction from which it arrived.

A first dielectric layer 122 (e.g., a first oxide layer) may be formed over layer 120. A first passivation layer 130 may be formed on the first dielectric layer 122. A second dielectric layer (e.g., a second oxide layer) may be formed on the first passivation layer 130. A second passivation layer 134 may be formed on the second dielectric layer 130. Passivation layers 130 and 134 may be formed from a nitride-based material (as an example).

Still referring to FIG. 3, color filter housing structures 180 may be formed in the active portion of image sensor die 102. Color filter housing structures 180 may include an array of slots 182 in which color filter elements may be inserted. An array of color filter elements that are contained within such types of housing structures are sometimes referred to as a CFA-in-a-box (abbreviated as "CIAB"). Color filter array housing structures 180 may have walls that are formed from the dielectric material in layer 132 and may serve to provide improved light guiding capabilities for directing light to desired image sensor pixels.

As shown in FIG. 3, inter-die via structures such as via structures 154 may traverse through at least a portion of die 102 and die 104. Via structures 154 may serve to connect circuitry within die 102 to circuitry within die 104. For example, vias 154 may connect metal routing structures 114 in dielectric stack 112 of die 102 to corresponding metal routing structures 108 in a dielectric stack 106 within die 104. Vias 154 may be formed through the oxide material in layers 132, 122, 112, and 106 and may therefore sometimes be referred to herein as through-oxide vias (TOVs). Vias 154 may also be formed through STI structures 118 at the front surface of substrate 110 (e.g., vias 154 may be formed through a single piece of STI 118).

In the example of FIG. 3, TOV structures 154 are coupled to an external bond pad such as bond pad 200. TOV structures 154 and bond pad 200 may be formed from different materials. As an example, TOV structures 154 may be formed from copper, whereas bond pad 200 may be formed from aluminum. Bond pad 200 may be coupled to external circuitry via bonding wires, solder balls, or other inter-die coupling mechanisms. Bond pad 200 may be formed on a dielectric layer 290. A passivation layer such as passivation layer 292 (e.g., a nitride-based layer) may be formed over bond pad 200. A portion of layers 290 and 292 directly over bond pad 200 may be selectively removed to expose the top surface of bond pad 200 to allow for wire bonding.

In FIG. 3, TOV structures 154 may be formed at the same time as the color filter housing structures 180. For example, after passivation layer 130 has been formed on dielectric layer 122, a first hole can be formed through layers 130, 122, 120, and substrate 110. Thereafter, oxide material 132 may be deposited on top of layer 130 and may coat the sidewall of the first hole (see, oxide liner 156 of TOV 154 in FIG. 3). In FIG. 3, sidewall liner 156 and layer 132 may represent the same dielectric layer. Once the oxide material for layer 132 has been formed, a second hole that is smaller than the first hole can be formed through the center of the first hole through layer 132, layer 130, layer 122, substrate 110, layers 112, and through at least a portion of the interconnect routing layers 106 in die 104 (e.g., the second hole may extend at least partly into DSP wafer 98).

Conductive material (e.g., copper, aluminum, tungsten, silver, gold, a combination of these materials, or other suitable conducting material) can then be deposited into the first and second holes to form TOV structure 154.

Still referring to FIG. 3, multiple shallow trench isolation structures 118 may be formed at the front surface of substrate 100 in scribe line region 90. Trenches such as trenches 210 may also be formed at least partly through layers 134, 132, 130, and 122 in region 90. Trenches 210 and shallow trench isolation structures 118 may serve as alignment features to which dicing equipment can be registered during wafer dicing operations. For example, the dicing equipment (not shown) may emit infrared (IR) light over the stacked wafers. The infrared light may strike the surface of wafer 96, and at least some of the infrared light may be reflected back towards the dicing equipment. The dicing equipment may also include infrared light sensors for detecting light that are being reflected back from the surface of wafer 96. IR light reflected back from scribe line region 90 may exhibit a recognizable pattern that can help align the dicing equipment to ensure that the wafers are cut along appropriate scribe lines.

As shown in FIG. 3, at least some substrate material 110 still remains within the scribe line region 90 (e.g., substrate 110 material may not be removed from the scribe line region). Having at least some substrate material 110 in region 90 can help reduce non-uniform stack height (i.e., to help maintain a uniform thickness across the image sensor die) which in turn helps in reducing coat streaks during later color filter processing.

In one suitable embodiment, scribe line region support structures such as support structures 212 may be formed on each side of scribe line region 90. Structures 212 may be trenches that traverse at least partly through at least layers 134, 132, 130, 122, 120, and 110 and may be filled with material that provides better mechanical robustness relative to semiconductor substrate material (e.g., silicon) or dielectric material (e.g., oxide). Structures 212 may be cylindrical support structures, rectangular slot structures (e.g., an elongated wall structure that runs along the periphery of the image sensor die), or structures with other suitable shapes/dimensions for providing mechanical support for scribe line region 90. Formed in this way, structures 212 may serve to reinforce the borders of each image sensor die to minimize damage to active circuitry within each image sensor die during wafer dicing operations (e.g., to shield the active circuitry from being exposed to undesirable mechanical stress during wafer sawing operations).

If desired, structures 212 may be formed at the same time as the through-oxide structures 154. For example, scribe line region support structures 212 and TOV structures 154 may be formed simultaneously by depositing copper or other suitable conductive material within corresponding trenches. In such scenarios, structures 212 and 154 may be formed from the same material. Forming vias 154 and support trench supports 212 in this way may reduce the total number of manufacturing steps and reduce cost.

Figure 4:
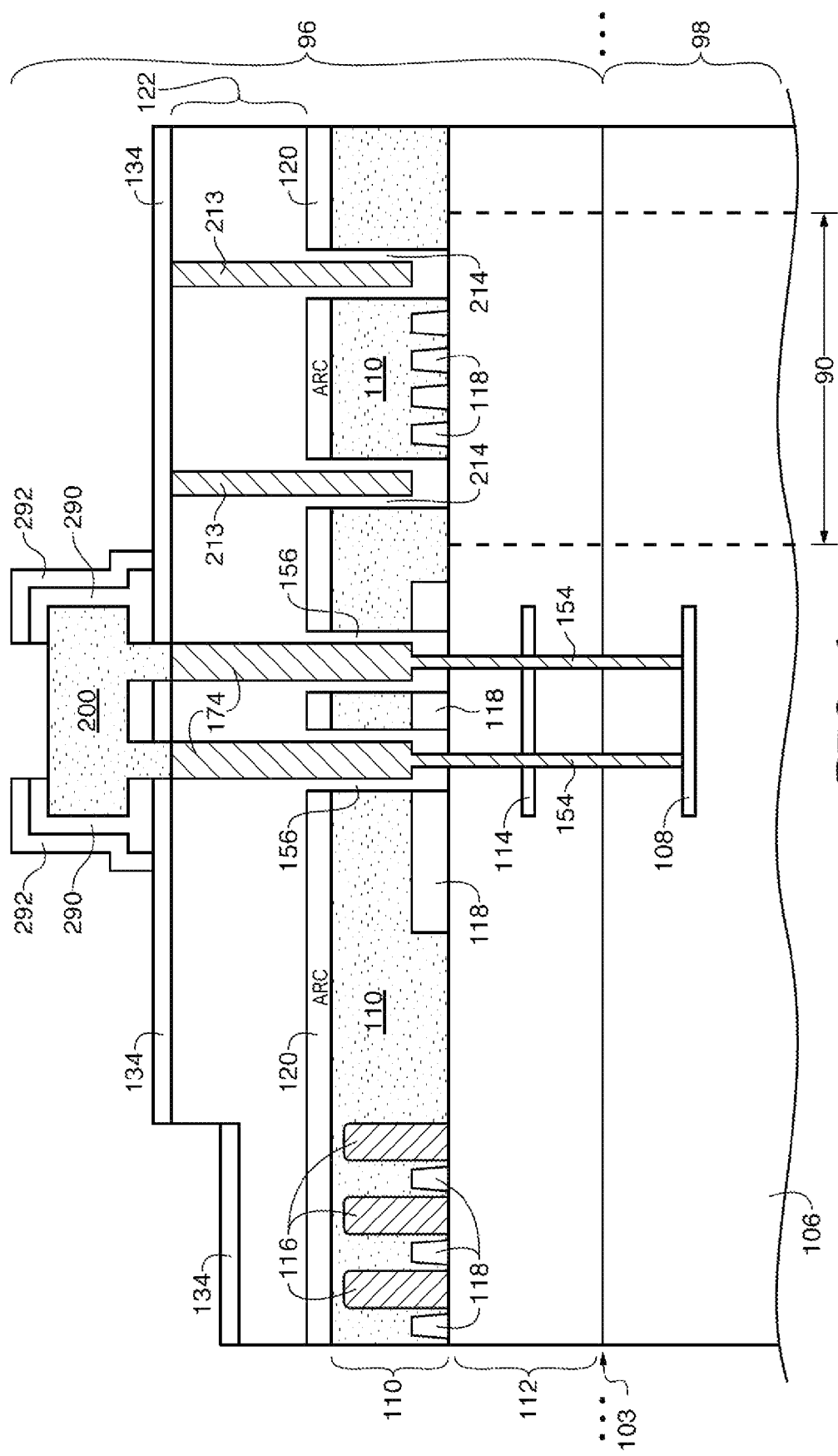
FIG. 4 is a cross-sectional side view of an illustrative imaging system having no color filter array housing structures and having metal trench structures surrounding scribe line regions in accordance with an embodiment of the present invention.

FIG. 4 shows another suitable arrangement in which no color filter housing structures are integrated on the image sensor die. As shown in FIG. 4, through-oxide vias 174 and scribe line region support structures 212 may be formed at least partially through dielectric layer 122, ARC layer 120, and substrate 110. The second dielectric layer (e.g., layer 132 in FIG. 3) need not be formed, and bond pad 200 can be formed on passivation layer 134 to electrically connect with TOVs 174.

In the embodiments of FIGS. 3 and 4, each of the TOV structures are separated from substrate material 110 by a distance that is proportional to the thickness of the TOV liner 156. Substrate 110 may be formed from semiconductor substrate material such as lightly doped silicon, which can be at least somewhat conductive. As a result, parasitic capacitance may exist between the TOV structures and the substrate material and can degrade the performance of signals that are conveyed on the TOV structures and increase power consumption.

Figure 5:
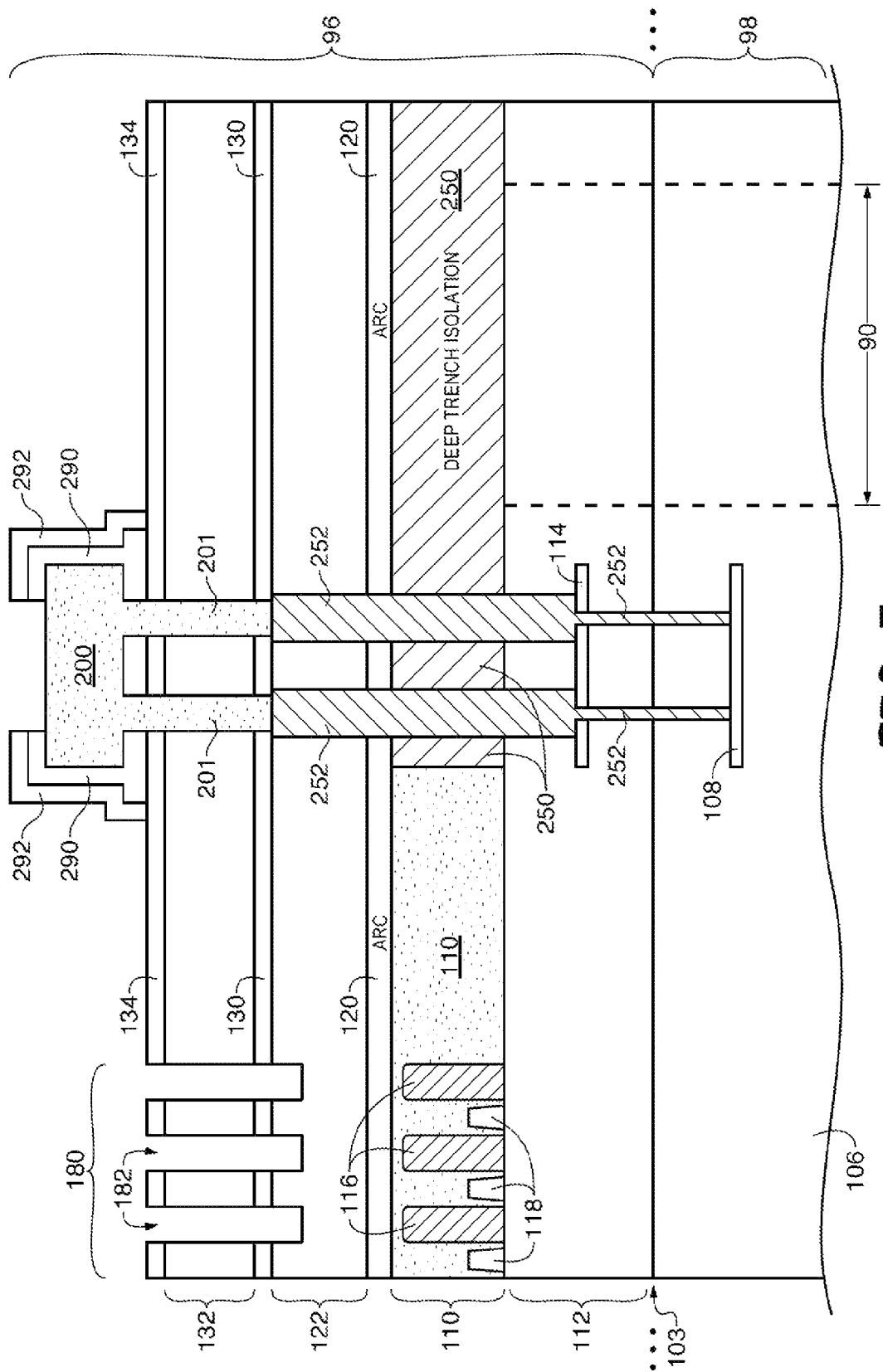
FIG. 5 is a cross-sectional side view of an illustrative imagine system having deep trench isolation structures formed at scribe line regions in accordance with an embodiment of the present invention.

FIG. 5 shows another suitable embodiment of an imaging system that can help reduce such types of parasitic capacitance. As shown in FIG. 5, deep trench isolation structures such as deep trench isolation structures (DTI) 250 may be formed in place of substrate material 110 in areas where the through-oxide structures are formed (e.g., TOV structures 252 may be formed through the DTI structures 250). For example, before or during the formation of substrate 110, a portion of substrate 110 where TOV structures 252 will later be formed may be completely removed. Deep trench isolation structures 250 can then be formed to fill the void left behind. The thickness of the deep trench isolation structures 250 may therefore be substantially similar to that of substrate 110.

Thereafter, ARC liner 120 may be formed directly on substrate 110 and DTI structures 250. First dielectric layer 122 can then be formed on liner 120. At least one hole can then be formed through layer 122, layer 120, and DTI structures 250 and may partially extend into the DSP die. Conductive material (e.g., copper) can then be deposited into the hole. TOV structures 252 may be coupled to external bond pad 200 using vias 201. TOV structures 252 formed in this way be experience reduced parasitic coupling capacitance to the semiconducting substrate material as long as the DTI structures 250 surrounding TOVs 252 separate the TOVs from the nearest substrate material by a distance that is greater than the thicknesses of liner 156 (see, FIGS. 3 and 4). In general, separate individual regions of DTI structures 250 that do not directly contact one another can be formed in different regions in the image sensor die for each respective set of through-oxide via structures. Creating separate individual regions of DTI may be beneficial because of material loading issues during wafer (110) thinning If there are large areas of DTI exposed during thinning of 110 then it will cause dishing and 110 thickness non-uniformity.

Still referring to FIG. 5, deep trench isolation structures 250 may extend entirely throughout the scribe line region 90. Having one continuous dielectric structure without any interfaces (i.e., without any materials transitions from oxide to silicon or vice versa) in scribe line region 90 can help enhance the mechanical robustness of the scribe line region during wafer dicing operations.

Figure 6:
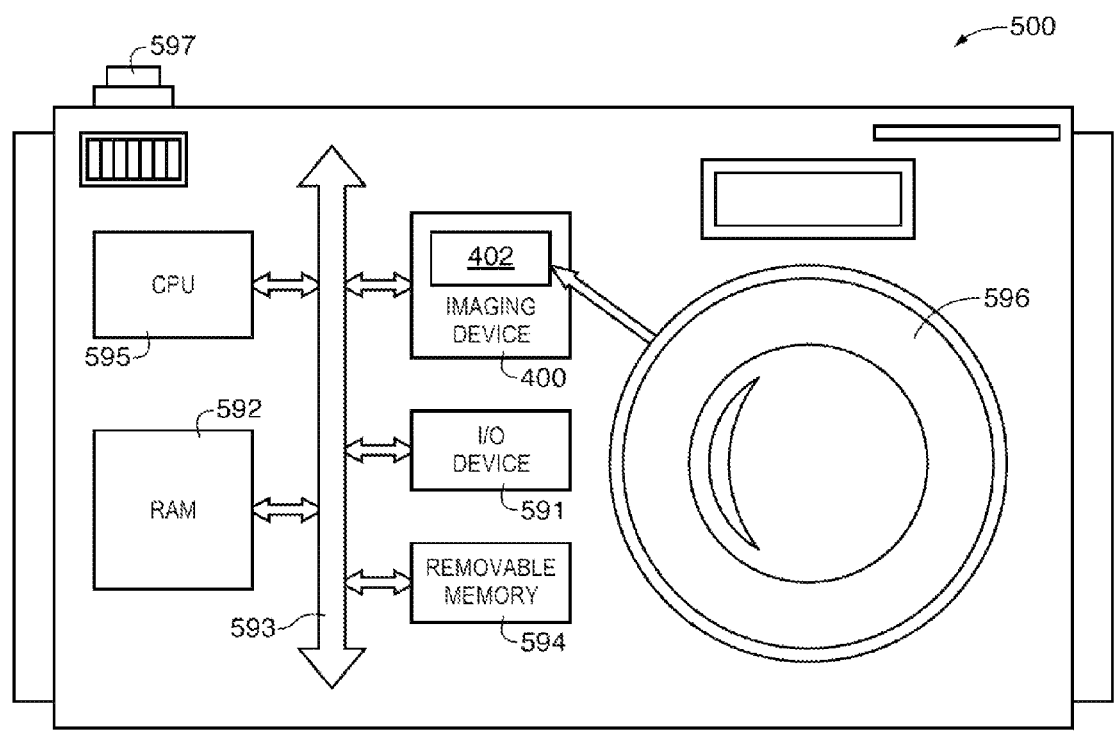
FIG. 6 is a block diagram of a system employing at least some of the embodiments of FIGS. 1-5 in accordance with an embodiment of the present invention.

FIG. 6 shows in simplified form a typical processor system 500, such as a digital camera, which includes an imaging device 400. Imaging device 400 may include a pixel array 402 having pixels of the type shown in FIG. 1 (e.g., pixel array 402 may be an array of image pixels formed on an image sensor SOC). Processor system 500 is exemplary of a system having digital circuits that may include imaging device 400. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel array such as pixel array 30 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 400 may also communicate with CPU 595 over bus 593. System 500 may include random access memory (RAM) 592 and removable memory 594. Removable memory 594 may include flash memory that communicates with CPU 595 over bus 593. Imaging device 400 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

In particular, imaging circuitry may include an image sensor die stacked on top of a digital signal processor (DSP) die. The image sensor die may include a substrate having front and back surfaces, a plurality of imaging pixels and shallow trench isolation (STI) structures formed at the front surface of the substrate, interconnect routing layer formed on the front surface of the substrate, and a layer of antireflective coating (ARC) material formed on the back surface of the substrate. The image sensor die may be a backside illuminated (BSI) image sensor die (as an example).

In one suitable arrangement, the image sensor die may include through-oxide via (TOV) structures that are formed through the substrate (e.g., that are formed through a single piece of STI structure) and that extends at least partly into the DSP die. The through-oxide via may be coupled to an external bond pad. Scribe line support structures may be formed along scribe line regions (i.e., regions at the boundaries of the image sensor die). The scribe line support structures may also be formed through the substrate at the same time as the TOV structures and may be formed using the same material as the TOV structures.

In another suitable arrangement, the through-oxide via structures may be formed through a deep trench isolation (DTI) structure. The DTI structure may be formed in the same layer as the substrate (e.g., the DTI structure may have the same thickness as the substrate). The substrate may be formed using a semi-conducting material, whereas the DTI structure may be formed using dielectric material. Forming TOV structures through the DTI structure may help reduce parasitic coupling on the TOV structures. If desired, the DTI structure may also extend into the scribe line region.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. A method of manufacturing imaging circuitry, comprising:
   stacking an image sensor wafer on a digital signal processor wafer;
   forming a through-oxide via in the image sensor wafer, wherein the through-oxide via extends at least partly into the digital signal processor wafer; and
   forming scribe line support structures at the same time as the through-oxide via.

2. The method defined in claim 1, wherein the scribe line support structures surround a scribe line region, the method further comprising:
   forming a plurality of shallow trench isolation structures in the scribe line region.

3. The method defined in claim 1, further comprising:
   forming a bond pad on the image sensor wafer that is coupled to the through-oxide via.

4. The method defined in claim 1, wherein the through-oxide via has a dielectric liner, the method further comprising:
   forming color filter array housing structures in the image sensor wafer, wherein the color filter array housing structures have walls that are formed at the same time as the dielectric liner of the through-oxide via.

5. The method defined in claim 1, wherein the scribe line support structures surround a scribe line region interposed between adjacent image sensor dies on the image sensor wafer, the method further comprising:
   dicing the image sensor wafer and the digital signal processor wafer along the scribe line region.

6. The method defined in claim 1, wherein forming the scribe line support structures comprises forming an elongated wall structure.

7. The method defined in claim 1, wherein forming the scribe line support structures comprises forming trenches through at least some substrate material in the image sensor wafer.

8. Imaging circuitry, comprising:
   a signal processor die; and
   an image sensor die stacked on the signal processor die, wherein the image sensor die comprises:
      a substrate layer;
      a deep trench isolation structure formed in the substrate layer; and
      a through-oxide via that is formed through the deep trench isolation structure and that extends at least partly into the signal processor die, wherein the deep trench isolation structure has at least a portion that extends into a scribe line region of the image sensor die, and wherein the portion of the deep trench isolation structure has the same thickness as the substrate layer.

9. The imaging circuitry defined in claim 8, wherein the image sensor die comprises a backside illuminated image sensor die.

10. The imaging circuitry defined in claim 8, wherein the image sensor die further comprises:
    a bond pad structure that is coupled to the through-oxide via.

11. The imaging circuitry defined in claim 8, wherein the image sensor die further comprises:
    antireflective coating (ARC) material formed on a first surface of the substrate layer; and
    interconnect routing layers formed on a second surface of the substrate layer.

12. The imaging circuitry defined in claim 8, wherein the substrate layer is formed using semiconducting material, and wherein the deep trench isolation structure is formed using dielectric material.

13. A system, comprising:
    a signal processing unit;
    memory;
    a lens;
    input-output circuitry; and
    an imaging device that is stacked on the signal processing unit, wherein the imaging device comprises:
       a substrate having a front surface and a back surface;
       a plurality of imaging pixels formed in the front surface of the substrate;
       through-oxide via (TOV) structures formed through the substrate, wherein the through-oxide via structures extend at least partially into the signal processing unit;
       scribe line support structures that are formed along a scribe line region and that are also formed through the substrate; and
       an external bond pad that is electrically coupled to the through-oxide via structures, wherein the substrate is interposed between the external bond pad and the signal processing unit.

14. The system defined in claim 13, wherein the through-oxide via structures and the scribe line support structures are formed at the same time.

15. The system defined in claim 13, wherein the through-oxide via structures and the scribe line support structures are formed from the same material.

16. The system defined in claim 13, wherein the imaging device further comprises:
   an antireflective coating (ARC) liner formed at the back surface of the substrate.

17. The system defined in claim 13, wherein the imaging device further comprises:
   a single shallow trench isolation structure formed at the front surface of the substrate, wherein the through-oxide via structures are formed through the single shallow trench isolation structure, and wherein the portion of the single shallow trench isolation structure through which the through-oxide via structures are formed exhibits a thickness that is less than the thickness of the substrate.

18. The system defined in claim 17, wherein the imaging device further comprises:
   a plurality of shallow trench isolation structures formed at the front surface of the substrate adjacent to the scribe line support structures, wherein the scribe line support structures comprises elongated wall structures.

\* \* \* \* \*